United States Patent [19]

Rutz

[11] 4,095,331
[45] Jun. 20, 1978

[54] FABRICATION OF AN EPITAXIAL LAYER DIODE IN ALUMINUM NITRIDE ON SAPPHIRE

[75] Inventor: Richard Frederick Rutz, Cold Spring, N.Y.

[73] Assignee: The United States of America as represented by the Secretary of the Air Force, Washington, D.C.

[21] Appl. No.: 738,916

[22] Filed: Nov. 4, 1976

[51] Int. Cl.² .................... B01J 17/00; H01L 21/203; H01L 21/205
[52] U.S. Cl. ........................................ 29/589; 29/590; 148/174; 148/175; 156/611; 156/612; 357/4; 357/17; 357/45; 357/61; 423/412; 427/87
[58] Field of Search ............... 148/174, 175; 156/611, 156/612; 204/192; 252/62.3 GA; 423/406, 409, 412; 29/589, 590; 427/87; 357/4, 61, 17

[56] References Cited

U.S. PATENT DOCUMENTS

| | | | |
|---|---|---|---|
| 3,291,657 | 12/1966 | Sirtl | 148/175 |
| 3,493,444 | 2/1970 | Sirtl et al. | 148/175 |
| 3,577,285 | 5/1971 | Rutz | 148/175 |
| 3,660,180 | 5/1972 | Wajda | 148/175 |
| 3,783,009 | 1/1974 | Tramposch | 148/175 X |
| 3,865,655 | 2/1975 | Pankove | 148/189 |

OTHER PUBLICATIONS

Cuomo et al., "Growing Large Area . . . Aluminum Nitride Crystals" I.B.M. Tech. Discl. Bull., vol. 17, No. 9, Feb. 1975, pp. 2819-2820.
Tramposch; R. F., "Epitaxial Films . . . Chemical Vapor Transport" J. Electrochem. Soc., vol. 116, No. 5, May, 1969, pp. 654-658.
Berkenblit et al., "Reduction of Stress . . . Hetero-Epitaxial Layers" I.B.M. Tech. Disc. Bull., vol. 12, No. 9, Feb., 1970, p. 1489.

Primary Examiner—L. DeWayne Rutledge
Assistant Examiner—W. G. Saba
Attorney, Agent, or Firm—Joseph E. Rusz; William Stepanishan

[57] ABSTRACT

An ultraviolet light emitting diode array of aluminum nitride grown on a sapphire substrate is fabricated by sputtering a preliminary layer of aluminum nitride onto a sapphire substrate, then placing said coated substrate in contact with a source of aluminum nitride and heating said composite in a particular atmosphere, resulting in the deposition of layers of aluminum nitride onto said coated substrate.

6 Claims, 3 Drawing Figures

FABRICATION OF AN EPITAXIAL LAYER DIODE IN ALUMINUM NITRIDE ON SAPPHIRE

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to epitaxial layer diodes, and in particular to an ultraviolet light emitting diode array in aluminum nitride on a sapphire base.

In the prior art, semiconductor circuits usually utilized as a base a slice of single crystal silicon, more or less circular, about 2 in. in diameter, and a fraction of an inch thick. Typically, this material is doped with p-type impurities. A film of semiconductor, less than 1/1000 in. thick, is then grown upon this substrate in a vapor-phase reaction of a silicon-containing compound. The conditions of this reaction are such that the film maintains the single-crystal nature of the substrate. Such films are called epitaxial. By incorporating n-type impurities into the gas from which the film is grown, the resulting epitaxial film is made n-type.

The silicon slice is then placed into an oxygen atmosphere at high temperatures (1200° C). The silicon and oxygen react, forming a cohesive silicon dioxide film upon the surface of the slice that is relatively impervious in the electrically active impurities.

To form the particular semiconductor regions required in the fabrication of electronic devices, however, p and n-type impurities must be introduced into certain regions of the semiconductor. In the planar technology, this is done by opening windows in the protective oxide layer by photoengraving techniques, and then exposing the slice to a gas containing the appropriate doping impuritiy. In the case of an integrated circuit, the isolation regions — p-type regions which, together with the p-type substrate, surround the separate pockets of the n-type film — are formed first by the diffusion of a p-type impurity. This is followed by a shorter exposure to p-type impurities during which the base region of the transistors and the resistors are formed. This procedure is repeated until the desired elements and a particular circuit configuration is finally established.

SUMMARY

The present invention utilizes a sapphire (Al$_2$O$_3$) substrate base upon which is grown an array of ultraviolet light emitting diodes. The sapphire substrate is sputtered with aluminum nitride (AlN) at the points at which the diodes are to be grown. The sputtered substrate is then placed in contact with an aluminum nitride (AlN) source in an atomosphere containing a combination of hydrogen, H$_2$ and nitrogen, N$_2$. The aluminum nitride layers are grown in this environment when heat is applied.

These and other advantages, objects and features of the invention will become more apparent from the following description taken in connection with the illustrative embodiment in the accompanying drawings.

DESCRIPTION OF THE PREFERRED EMBODIMENT

Figure 1:
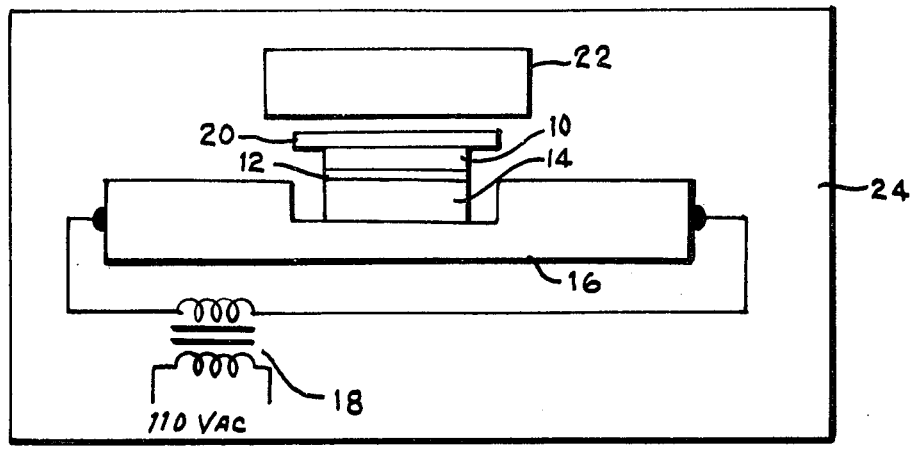
FIG. 1 is schematic diagram of the diode-forming apparatus in accordance with the present invention.

Referring now to FIG. 1, there is shown a diode-forming apparatus for fabricating an ultraviolet light emitting diode array on a sapphire substrate base. A sapphire (Al$_2$O$_3$) substrate 10 is sputtered with a thin layer (0.2 to 2 mils) of aluminum nitride (AlN), 12 prior to being placed in the diode-forming apparatus. The sapphire base 10 with the aluminum nitride 12 sputtered thereon is placed with the aluminum nitride side facing down onto a sintered aluminum nitride source 14. The tungsten heater 16 has a cavity therein formed to accommodate the sintered aluminum nitride source 14. The tungsten heater 16 is connected to a 110 VAC power source 18. The sapphire substrate 10 is covered with a thin tungsten reflector 20 which is also covered with an insulating material 22, such as carbon felt or some other suitable insulating material.

Prior to the application of power to the tungsten heater 16, the entire apparatus and elements are placed in an enclosed chamber 24 with a controlled environment. The inside of the chamber 24 is filled with a gas atmosphere of hydrogen, H$_2$ and nitrogen, N$_2$. The ratio between the gases is maintained at 90% hydrogen and 10% nitrogen during the entire process of growing the aluminum nitride layers on the sapphire base. Power is applied to the tungsten heater 16 to raise the temperature within the chamber 24 to 1800° C. During this heating process, material from the aluminum nitride source 14 is transferred to the sputtered aluminum nitride 12 to form layers of aluminum nitride on the sapphire base 10 which is conductive at room temperature when electrically excited. The ultraviolet light emitting diodes are formed by alloying small aluminum dots near each other on the pyrolytically grown aluminum nitride layers. In the present process, with care being taken in slowly heating and cooling the elements, the growth does not tend to crack due to differences in thermal coefficients of expansion as in the case of tungsten substrates. Should crack occur, it tends to be in the sapphire rather than the aluminum nitride. The use of sapphire is also compatible with other technologies such as silicon or sapphire and offers the possibility of making arrays of small closely spaced sources, such as would be useful in printing and display applications.

Figure 2:
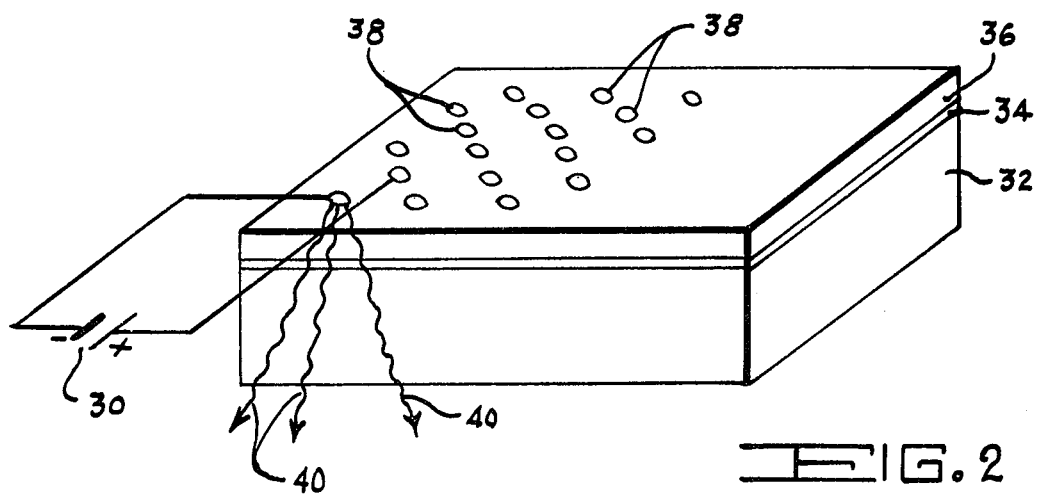
FIG. 2 is an isometric view of an ultraviolet light emitting diode array, and, FIG. 3 is a graphical representation of the diode light output with respect to wavelength.

Turning now to FIG. 2, there is shown an ultraviolet light emitting diode array connected to a D.C. voltage source 30. The ultraviolet light emitting diode array comprises a sapphire substrate 32, an area of sputtered aluminum nitride 34, a layer of vapor-grown aluminum nitride 36, and a plurality of alloyed aluminum data 38. The adjacent dots are connected to the D.C. voltage source 30 and light 40 is emitted most brightly from the vicinity of the negatively poled contact. The sapphire substrate 32 is quite transparent to the radiation. Other metals may be used for the positive contact, such as titanium or silicon or chromium.

Figure 3:
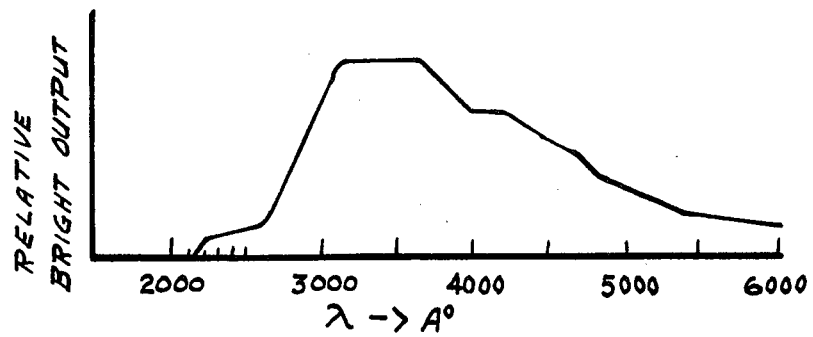

In FIG. 3 there is shown a graphical representation of the radiation which is emitted from the present ultraviolet light emitting diode array. The light spectrum of a typical ultraviolet light emitting diode array has a peak light output of apporximately 3500A° and extends to 2200A° in the ultraviolet region. Thus, it may be seen that an array of diodes which have thus been constructed, have the capability of emitting ultraviolet radiation.

Although the invention has been described with reference to a particular embodiment, it will be understood to those skilled in the art that the invention is capable of a variety of alternative embodiments within the spirit and scope of the appended claims.

What is claimed is:

1. A method of making a light emitting diode array comprising the steps of:

sputtering aluminum nitride onto a sapphire substrate, placing said sapphire substrate in contact with a source material of aluminum nitride in a gaseous environment of a predetermined ratio, heating said sapphire substrate and said source material to a predetermined temperature, depositing said source material onto said sapphire substrate to a predetermined thickness to form a layered surface, and alloying a plurality of conductive dots onto the surface of said layered surface in a predetermined configuration.

2. A method of making a light emitting diode array as recited in claim 1 wherein said gaseous environment comprises hydrogen and nitrogen.

3. A method of making a light emitting diode array as recited in claim 1 wherein said predetermined ratio comprises 90% hydrogen and 10% nitrogen.

4. A method of making a light emitting diode array as recited in claim 1 wherein said predetermined temperature equals 1800° C.

5. A method of making a light emitting diode array as recited in claim 1 wherein said source material comprises sintered aluminum nitride.

6. A method of making a light emitting diode array as recited in claim 1 wherein said conductive dots comprise aluminum.

* * * * *